United States Patent
Muguet

(10) Patent No.: US 8,669,814 B2
(45) Date of Patent: Mar. 11, 2014

(54) DEVICE FOR NEUTRALIZING A SIGNAL OBTAINED BY MODULATING, ON TO A HIGH FREQUENCY CARRIER, A USEFUL SIGNAL DELIVERED BY A SYSTEM

(75) Inventor: Jean-Michel Muguet, Rochefort-Samson (FR)

(73) Assignee: Thales, Neuilly-sur-Seine (FR)

( * ) Notice: Subject to any disclaimer, the term of this patent is extended or adjusted under 35 U.S.C. 154(b) by 99 days.

(21) Appl. No.: 13/490,777

(22) Filed: Jun. 7, 2012

(65) Prior Publication Data
US 2012/0313711 A1 Dec. 13, 2012

(30) Foreign Application Priority Data
Jun. 10, 2011 (FR) ...................................... 11 01783

(51) Int. Cl.
*H03F 1/14* (2006.01)
(52) U.S. Cl.
USPC ........................................................ 330/292
(58) Field of Classification Search
USPC .................... 330/292, 277, 76, 278
See application file for complete search history.

(56) References Cited

U.S. PATENT DOCUMENTS

| 4,829,265 A * | 5/1989 | Susak | ........................... 330/253 |
| 2009/0295477 A1 | 12/2009 | Dasgupta | |
| 2010/0148875 A1 | 6/2010 | Augustyniak | |

OTHER PUBLICATIONS

Benjamin J, Blalock et al.; "Designing 1-V Op Amps Using Standard Digital CMOS Technology"; IEEE Transactions on Circuits and Systems II: Analog and Digital Signal Processing; vol. 45, No. 7; Jul. 1998, New York, New York USA.
Institut National De La Propriete Industrielle; Preliminary Search Report; Mar. 5, 2012; Paris, France.

* cited by examiner

*Primary Examiner* — Hieu Nguyen
(74) *Attorney, Agent, or Firm* — Michael J. Donohue; Davis Wright Tremaine LLP

(57) ABSTRACT

The invention relates to a device for neutralizing a signal obtained by modulating, on to a high frequency carrier, a useful signal delivered by a system comprising a parasitic capacitance Cp that varies over time, the device comprising a neutralizing capacitance Cn, means for providing an adjustable gain G, said means being equipped with a JFET field-effect transistor (J1) equipped with a gate first electrode and drain and source second electrodes, and a control loop for providing gain G so that G×Cn permanently equals Cp by controlling the voltage on the gate first electrode of the transistor (J1). The neutralizing capacitance Cn comprises a first capacitor Cneutro1 and a second capacitor Cneutro2 placed in parallel at the output of said means for providing gain G.

21 Claims, 3 Drawing Sheets

DEVICE FOR NEUTRALIZING A SIGNAL OBTAINED BY MODULATING, ON TO A HIGH FREQUENCY CARRIER, A USEFUL SIGNAL DELIVERED BY A SYSTEM

The present invention relates to an active neutralizing device. The invention is applicable, for example, to the field of electronics for processing data from MEMS (microelectromechanical system) sensors.

Electronics for processing data from capacitive sensors and detectors may require an HF (high-frequency) carrier to act as a medium for the useful data, the carrier having a frequency 10 to 20 times higher than that of the useful signal. The HF carrier must then be removed or attenuated in the stages for amplifying and demodulating the useful signal to be processed. Neutralization consists in injecting, into these stages, a signal in phase opposition to the HF carrier. The level of the signal in phase opposition allows the HF carrier to be cancelled out or attenuated and thus the signal-to-noise ratio to be increased and saturation of the stages for amplifying and demodulating the useful signal to be prevented.

Figure 1:
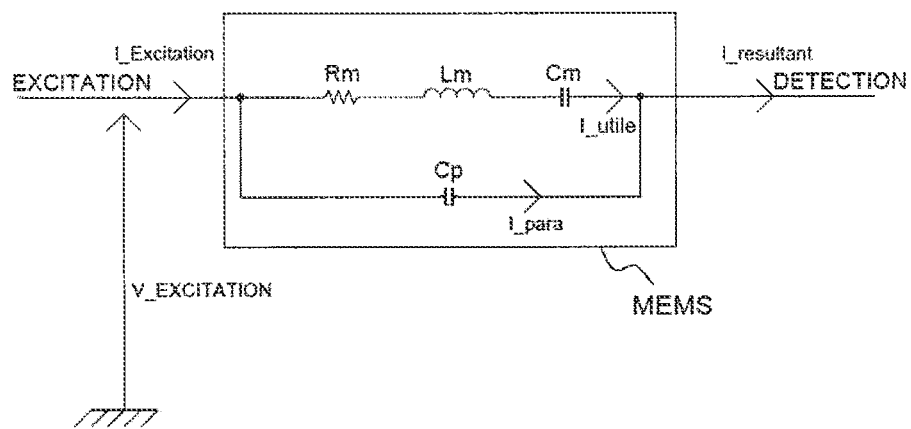

For example, MEMS sensors require a neutralizing function to be incorporated in order to compensate for the presence of a parasitic capacitance Cp (inherent in the design) between the detection and excitation electrodes. The equivalent circuit diagram of the MEMS sensor or resonator is the RLC circuit (Rm, Lm and Cm) in FIG. 1.

Figure 2:

Because the parasitic capacitance Cp is present, part of the excitation current I_Excitation is diverted into the parasitic capacitance Cp and thus interferes with the measurement. The resultant current I_resultant is no longer equal to and in phase with the useful current I_utile flowing through the RLC circuit (Rm, Lm and Cm). At the resonant frequency, I_utile is in phase with V_Excitation. FIG. 2 shows a phasor diagram of the various currents.

Neutralization consists in processing the resultant current I_resultant so that it equals and is in phase with the useful current I_utile.

As explained in the rest of the present application, neutralizing techniques used at the present time require adjustments to be made via potentiometers or similar devices. On the one hand these adjustments must be carried out individually on each sensor or detector, because the amount of adjustment required is often directly related to poorly controlled parasitic capacitances in the sensor or detector. On the other hand, since these adjustments are carried out once and for all during the initial production phases of the sensor or detector, any subsequent variation or drift cannot be compensated for.

Figure 3:
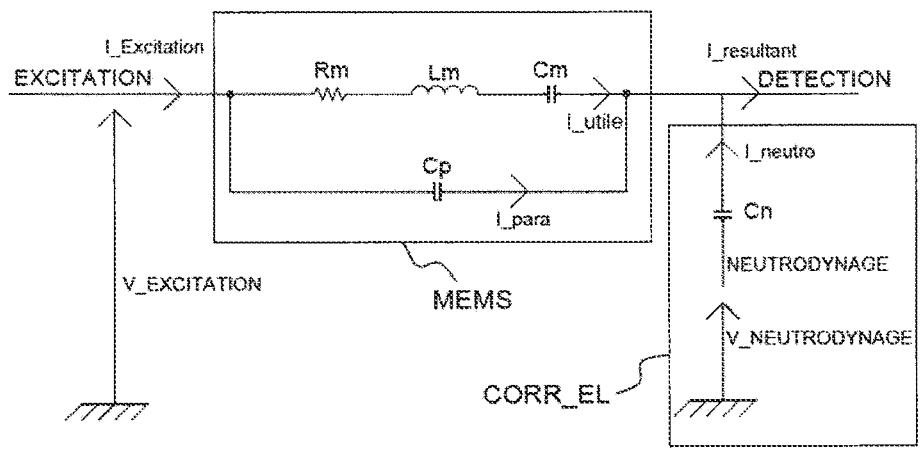
Figure 4:
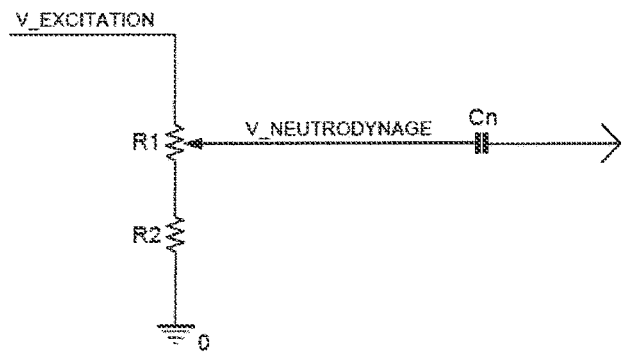
Figure 5:
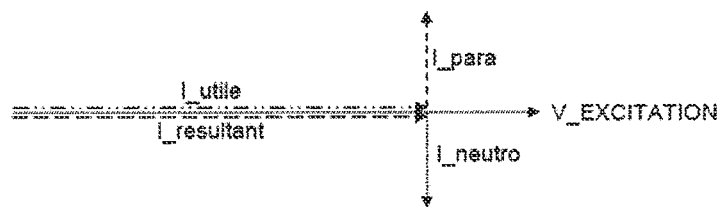

In the past, this problem has been solved by what is called passive neutralization, as illustrated by the device in FIGS. 3, 4 and 5, in which a neutralizing current I_neutro, equal and opposite to the parasitic current I_para, is injected through a capacitor Cn. After neutralization the resultant and useful currents I_resultant and I_utile output by the MEMS sensor are once again equal and in phase.

FIG. 5 illustrates a Fresnel diagram of these currents.

To perfectly compensate the parasitic current I_para with the neutralizing current I_neutro, the following relationships must be respected:

Applying Kirchoffs current law to FIG. 3 gives the following relationship:

$$I\_resultant=I\_utile+I\_para+I\_neutro;$$

however it is desired that I_resultant=I_utile.
It is therefore necessary for I_neutro=−I_para, where $I\_neutro=Cn \times \{d(V\_NEUTRODYNAGE)/dt\}$
and $$I\_para=Cp \times \{d(V\_EXCITATION)/dt\}.$$

Converting to the Laplace variable p=j×w where w=2×π×f and j is the imaginary unit of a complex number gives:

$$I\_neutro=Cn \times j \times w \times V\_NEUTRODYNAGE \text{ and}$$

$$I\_para=Cp \times j \times w \times V\_EXCITATION.$$

As it is desired for I_neutro=−I_para, i.e. for $$Cn \times V\_NEUTRODYNAGE=-Cp \times V\_EXCITATION$$

if Cn=Cp then $$V\_NEUTRODYNAGE=-V\_EXCITATION$$

However, it is impossible to provide a capacitor with a capacitance Cn that exactly equals the parasitic capacitance Cp because capacitors have capacitances that are standardized and preset and therefore only a limited number of values are available.

Thus, as we are left with the following relationship: Cn×V_NEUTRODYNAGE=−V_EXCITATION×Cp, Cn is chosen such that Cn=k×Cp where k>1. It is therefore necessary to set the voltage V_NEUTRODYNAGE to the voltage −V_EXCITATION/k. The negative sign indicates that there needs to be perfect phase opposition between V_NEUTRODYNAGE and V_EXCITATION/k, k being greater than 1 and the ratio 1/k indicating that attenuation is required.

The gain G (or rather the attenuation), equal to 1/k, is obtained by a voltage divider produced with a potentiometer and a resistor (cf. FIG. 4). This gain or attenuation is permanently set in the factory at the start of the lifetime of the product. Such devices have various drawbacks, especially the manual adjustment of the neutralizing voltage using potentiometers, which, carried out once at room temperature, does not adapt to variations caused by temperature drift or by drift due to modification or degradation of the operation of the MEMS sensors over time.

FIG. 4 illustrates an exemplary passive neutralizing device.

Devices are known, as described in French patent application FR 1,005,079, that employ active neutralization that continuously adjusts so as to optimise the residual level of the HF carrier. Specifically, the subject of French patent application FR 1,005,079 is a device for neutralizing a signal obtained by modulating, on to a high frequency carrier, a useful signal delivered by a system, said system having a parasitic capacitance Cp that varies over time. The device comprises a neutralizing capacitance Cn and means for providing an adjustable gain G, and means for slaving the gain G such that G×Cn permanently equals Cp. For example, the means for providing the adjustable gain G may include a JFET transistor, the slaving means possibly using a voltage to adjust the gain of said transistor.

A JFET (junction field effect transistor) is a field effect transistor the gate of which makes direct contact with the channel. A JFET is a voltage controlled device (the drain current depends on the gate-source voltage Vgs).

Such active neutralization allows, by means of a control loop (also known as feed-back mechanism), the neutralizing voltage to be continuously controlled so that the neutralizing current I_neutro permanently compensates the parasitic current I_para. This solution means that manual adjustment is no longer necessary (order of magnitude decrease in RC: € 50 per sensor) and allows drift due to variations in temperature and over time to be compensated for.

Figure 6:
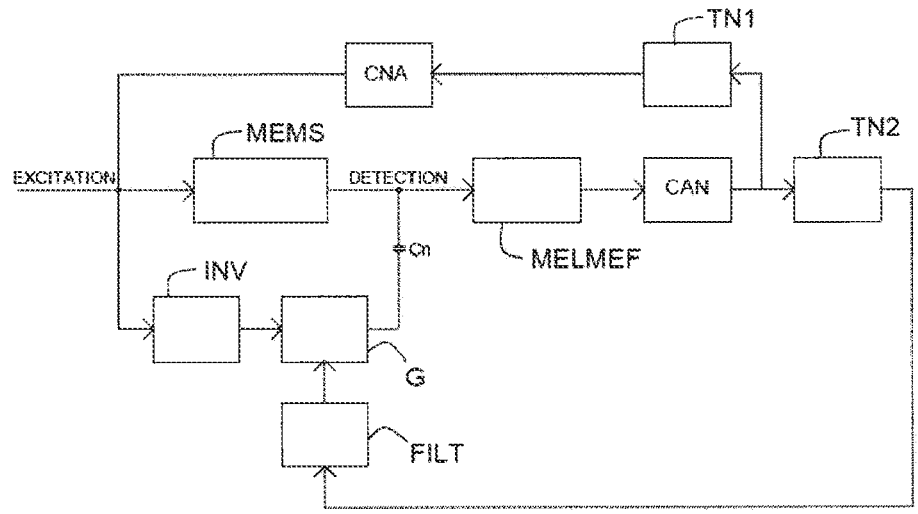

FIG. 6 schematically illustrates, in its entirety, a neutralizing device for a MEMS sensor.

A MEMS sensor is a sensitive element that senses a physical quantity (acceleration, pressure, rotation, magnetic field strength, etc.). An electronic transformation module MELMEF allows the mechanical movement of the MEMS sensor to be transformed into an electrical (voltage) signal and this signal to be amplified (i.e. given a sufficient amplitude). An analogue-to-digital converter CAN allows the analogue signal to be converted into a digital signal. A first digital processing module TN1 guarantees that the mechanical movement of the MEMS sensor continues, via a control loop. A digital-to-analogue converter CNA allows the digital signal to be converted into an analogue signal transmitted to an inverter INV, and to an input of the MEMS sensor. The inverter INV allows the signal EXCITATION exciting the MEMS sensor to be inverted so as to create the inverse signal −EXCITATION and the neutralizing function to be provided. A module providing a gain G equal to 1/k makes variable-gain attenuation possible. A second digital processing module TN2 generates feed-back, in order to send the correct control signal to the JFET of the gain-providing module G. A filtering module FILT allows the digital signal generated by the second digital processing module TN2 to be filtered in order to control the DC voltage (Vgs) of the JFET.

However, in order for the active neutralization to function correctly, it is necessary to provide a variable-gain attenuator that introduces negligible phase-shift and distortion.

The term "distortion" is understood to mean deformation or alteration of the sinusoidal signal, creating a number of spurious in the frequency domain.

One aim of the invention is to mitigate the problems mentioned above.

According to one aspect of the invention, a device is provided for neutralizing a signal obtained by modulating, on to a high frequency carrier, a useful signal delivered by a system comprising a parasitic capacitance Cp that varies over time, the device comprising a neutralizing capacitance Cn, means for providing an adjustable gain G, said means being equipped with a JFET field-effect transistor equipped with a gate first electrode and drain and source second electrodes, and means for slaving said means for providing gain G so that G×Cn permanently equals Cp by controlling the voltage on the gate first electrode of the transistor. The neutralizing capacitance comprises a first capacitor Cneutro1 and a second capacitor Cneutro2 placed in parallel at the output of said means for providing gain.

Such a device allows compensation for variations in the parasitic capacitance I_para over time and with temperature to be dynamically controlled while minimizing the phase-shift and the distortion of the signal V_NEUTRODYNAGE.

According to one embodiment, the first and second capacitors placed in parallel are connected by a first resistor of the means for providing gain.

Thus, the first capacitor Cneutro1 allows a rough first compensation of the parasitic capacitance Cp whereas the second capacitor Cneutro2 allows finer adjustment of the compensation. Using two capacitors also allows the voltage Vds of the JFET transistor J1 to have a low amplitude, so as to limit distortion of the signal V_NEUTRODYNAGE.

In another embodiment, the means for providing gain G comprise a second resistor connected on the one hand to the gate first electrode of said transistor, and on the other hand to a source second electrode of said transistor.

This second resistor allows the transistor J1 to be biased in the absence of a digital control signal.

According to another embodiment, said means for providing gain furthermore comprise a third resistor connected in series with said gate first electrode of said transistor, and a third capacitor directly connected on the one hand to the gate first electrode of the transistor, and on the other hand to a drain second electrode of the transistor, the latter electrode being directly connected to the second capacitor.

This third capacitor and this third resistor limit distortion of the signal at the drain of the transistor.

In another embodiment, said means for providing gain furthermore comprise a fourth resistor connected in parallel to the drain and source second electrodes of the transistor.

This fourth resistor limits the amplitude of the voltage across the terminals of the transistor J1 when it is turned on, and thus limits distortion.

For example, the system may comprise a microelectromechanical system or MEMS sensor, such as a gyrometer.

Figure 7:
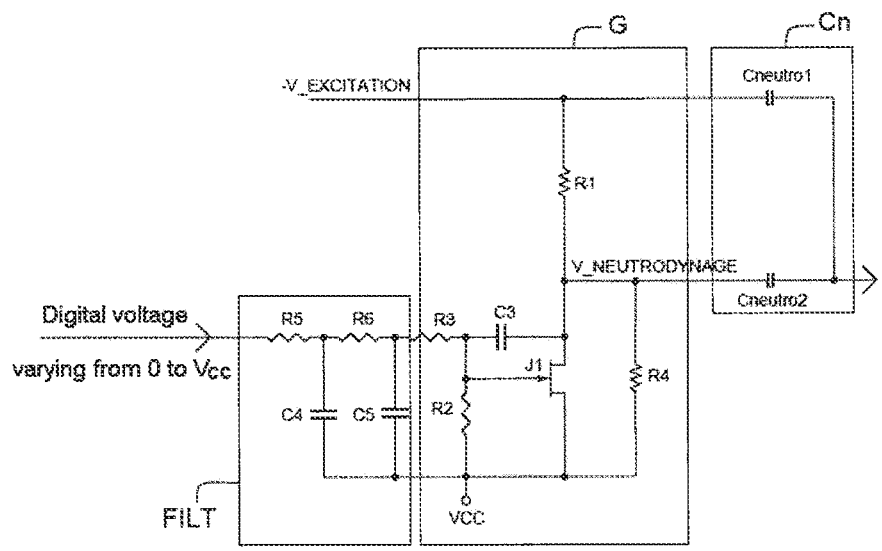

The invention will be better understood on studying a few embodiments described by way of non-limiting example and illustrated by the appended drawings in which:

FIGS. 1, 2, 3, 4, 5 and 6 schematically illustrate known embodiments of devices for passively neutralizing a signal obtained by modulating, on to a high frequency carrier, a useful signal delivered by a system such as a MEMS sensor; and FIG. 7 illustrates a device for actively neutralizing a signal obtained by modulating, on to a high frequency carrier, a useful signal delivered by a system comprising a parasitic capacitance, according to one aspect of the invention.

FIG. 7 schematically shows a device for neutralizing a signal obtained by modulating, on to a high frequency carrier, a useful signal delivered by a system comprising a parasitic capacitance, according to one aspect of the invention.

The device comprises a filter module FILT, a module G for providing a gain and a neutralizing capacitance Cn.

The neutralizing capacitance Cn comprises a first capacitor Cneutro1 and a second capacitor Cneutro2 placed in parallel at the output of the means for providing gain G.

Applying Kirchoffs current law to FIG. 6 gives the following relationship:

$$I\_resultant = I\_utile + I\_para + I\_neutro$$

where $I\_neutro = I\_neutro1 + I\_neutro2$;

however, it is desired that I_resultant=I_utile.

It is therefore necessary for I_neutro=−I_para i.e. for I_neutro1+I_neutro2=−I_para, where $I\_neutro1 = Cneutro1 \times \{d(-V\_EXCITATION)/dt\}$, $$I\_neutro2 = Cneutro2 \times \{d(V\_NEUTRODYNAGE)/dt\},$$ and $$I\_para = Cp \times \{d(V\_EXCITATION)/dt\}.$$

Converting to the Laplace variable: p=j×w where w=2×π×f and j is the imaginary unit of a complex number gives:

$$I\_neutro1 = Cneutro1 \times j \times w \times (-V\_EXCITATION),$$

$$I\_neutro2 = Cneutro2 \times j \times w \times V\_NEUTRODYNAGE,$$ and $$I\_para = Cp \times j \times w \times V\_EXCITATION.$$

As it is desired for I_neutro1+I_neutro2=−I_para i.e. for:

$$Cneutro1 \times (-V\_EXCITATION) + Cneutro2 \times V\_NEUTRODYNAGE = -Cp \times V\_EXCITATION$$

where $V\_NEUTRODYNAGE = -V\_EXCITATION/k$ the following is therefore obtained:

$$Cneutro1 + Cneutro2/k = Cp.$$

Such an embodiment of the neutralizing capacitance Cn allows a rough compensation of the parasitic capacitance Cp to be achieved with the first capacitor Cneutro1 whereas the capacitor Cneutro2 allows finer adjustment of the compensation. Using two capacitors also allows the voltage Vds of the JFET transistor J1 to have a low amplitude, so as to limit distortion of the signal V_NEUTRODYNAGE.

The first capacitor Cneutro1 is chosen to have a normalized capacitance lower than the smallest parasitic capacitance Cp to be compensated. It must compensate between 75% and 95% of the Cp value.

Regarding the second capacitor Cneutro2, its capacitance depends on the gain 1/k chosen and the capacitance of Cneutro1. The higher the k value, the lower the voltage Vds across the terminals of the transistor J1 and the lower the distortion. It is common to take a k value of between 10 and 100. Thus the capacitance of Cneutro2 could lie between Cp/2 and 25×Cp.

The system, for example a MEMS sensor such as a gyrometer, comprises a parasitic capacitance Cp that varies over time. The gain-providing module G provides a gain that can be adjusted.

The gain-providing module G is equipped with a JFET field-effect transistor J1 equipped with a gate first electrode and drain and source second electrodes. The gain-providing module G also comprises a control loop for providing gain G so that Gain×Cn permanently equals Cp, by controlling the voltage on the gate first electrode of the transistor J1.

The JFET transistor J1 has an n-type channel and its resistance (drain-source resistance Rds) varies depending on the control signal applied to the gate (gate-source voltage Vgs). The following expression relates the resistance Rds (in ohms) at gate voltage Vgs (in volts) to the pinch-off voltage Vp (in volts) and the saturation current Idss (in amperes):

$$Rds(Vgs) = \frac{1}{2\frac{Idss}{Vp^2} \cdot (Vgs - Vp)}.$$

The first capacitor Cneutro1 and the second capacitor Cneutro2, placed in parallel, are connected by a first resistor R1 of the means for providing gain G.

The gain-providing module G comprises a second resistor R2 connected on the one hand to the gate first electrode of the transistor J1, and on the other hand to a source second electrode of the transistor J1.

The gain-providing module G furthermore comprises a third resistor R3 connected in series with said gate first electrode of said transistor J1, and a third capacitor C3 directly connected on the one hand to the gate first electrode of said transistor J1, and on the other hand to a drain second electrode of the transistor J1, the latter electrode being directly connected to the second capacitor Cneutro2.

The presence of this third capacitor C3 limits distortion of the signal at the drain of the transistor J1.

The gain-providing module G furthermore comprises a fourth resistor R4 connected in parallel to the drain and source second electrodes of the transistor J1.

An exemplary embodiment of the filter module FILT may be that shown in FIG. 7, comprising a fifth resistor R5 and a sixth resistor R6 connected in series, and a fourth capacitor C4 and a fifth capacitor C5 connected together in parallel, one terminal of the fourth capacitor C4 being connected between the fifth and sixth resistors R5 and R6, and one terminal of the fifth capacitor C5 being connected to the other terminal of the sixth resistor R6.

The first resistor R1 and the transistor J1 thus form a voltage divider, and the fourth resistor R4 allows the gain and the signal amplitude across the terminals of the transistor J1 to be limited.

The filter module FILT, composed of two RC cells (R5/C4 and R6/C5), allows the high-frequency digital control signal to be converted into a DC voltage that switches from 0 to Vcc (Vcc being the voltage supplied to the inputs/outputs of the digital core) with a duty cycle set by the digital control signal. The digital control signal is a PWM (pulse width modulation) signal.

The third capacitor C3 attenuates distortion and the second and third resistors R2 and R3 allow the control voltage applied to the gate to be given the desired value. The second resistor R2 also sets the electrical potential of the gate in the absence of a digital control signal, especially on turn-on.

In order to bias the JFET J1 correctly, it is necessary to control the voltage Vgs with a negative voltage varying from Vp to 0 volts, Vp being the pinch-off voltage of the transistor J1, the value of which is negative.

Since the digital control signal has a positive voltage which can vary only between 0 volts and Vcc, it is necessary to bias the source of the transistor J1 with the voltage Vcc in order to obtain the negative Vgs voltage.

It is therefore necessary to choose a transistor the pinch-off voltage Vp of which is higher than or equal to −Vcc. For example, for a Vcc voltage of 3 V, the transistor PMBF4393 could be a good choice, and for a Vcc voltage of 5 V, the transistor PMBF4392 could be a good choice.

The first capacitor Cneutro1 allows about 75% to 95% of the parasitic capacitance Cp to be compensated and the remaining 5% to 25% is compensated by the voltage divider (formed by R1, R4 and J1) and the second capacitor Cneutro2. Thus, the amplitude of the voltage across the terminals of J1 (drain-source voltage Vds) is reduced and distortion is limited.

The invention thus provides an electronic function producing attenuation with a gain that can be varied using a digital control signal without generating too great a phase-shift about 200 kHz between the input signal and the output signal.

The invention also provides an electronic function producing attenuation with a gain that can be varied using a digital control signal without generating too much distortion about 200 kHz between the input signal and the output signal.

The invention furthermore allows, throught the injection of the compensation signal through two neutralizing capacitors, distortion of the signal V_NEUTRODYNAGE to be greatly attenuated.

The invention claimed is:

1. Device for neutralizing a signal obtained by modulating, on to a high frequency carrier, a useful signal delivered by a system comprising a parasitic capacitance Cp that varies over time, the device comprising a neutralizing capacitance Cn, means for providing an adjustable gain G, said means being equipped with a JFET field-effect transistor (J1) equipped with a gate first electrode and drain and source second electrodes, and a control loop for providing gain G so that G×Cn permanently equals Cp by controlling the voltage on the gate first electrode of the transistor (J1), characterized in that the neutralizing capacitance Cn comprises a first capacitor Cneutro1 and a second capacitor Cneutro2 placed in parallel at the output of said means for providing gain G.

2. Device according to claim 1, in which the first and second capacitors Cneutro1 and Cneutro2 placed in parallel are connected by a first resistor (R1) of the means for providing gain G.

3. Device according to claim 2, in which the means for providing gain G comprise a second resistor (R2) connected on the one hand to the gate first electrode of said transistor (J1), and on the other hand to a source second electrode of said transistor (J1).

4. Device according to claim 2, in which said means for providing gain G furthermore comprise a third resistor (R3) connected in series with said gate first electrode of said transistor (J1), and a third capacitor (C3) directly connected on the one hand to the gate first electrode of said transistor (J1), and on the other hand to a drain second electrode of said transistor (J1), the latter electrode being directly connected to said second capacitor Cneutro2.

5. Device according to claim 2, in which said means for providing gain G furthermore comprise a fourth resistor (R4) connected in parallel to the drain and source second electrodes of the transistor (J1).

6. Device according to claim 2, in which the system comprises a microelectromechanical system (MEMS).

7. Device according to claim 6, in which the MEMS unit is a gyrometer.

8. Device according to claim 1, in which the means for providing gain G comprise a second resistor (R2) connected on the one hand to the gate first electrode of said transistor (J1), and on the other hand to a source second electrode of said transistor (J1).

9. Device according to claim 8, in which said means for providing gain G furthermore comprise a third resistor (R3) connected in series with said gate first electrode of said transistor (J1), and a third capacitor (C3) directly connected on the one hand to the gate first electrode of said transistor (J1), and on the other hand to a drain second electrode of said transistor (J1), the latter electrode being directly connected to said second capacitor Cneutro2.

10. Device according to claim 8, in which said means for providing gain G furthermore comprise a fourth resistor (R4) connected in parallel to the drain and source second electrodes of the transistor (J1).

11. Device according to claim 8, in which the system comprises a microelectromechanical system (MEMS).

12. Device according to claim 11, in which the MEMS unit is a gyrometer.

13. Device according to claim 1, in which said means for providing gain G furthermore comprise a third resistor (R3) connected in series with said gate first electrode of said transistor (J1), and a third capacitor (C3) directly connected on the one hand to the gate first electrode of said transistor (J1), and on the other hand to a drain second electrode of said transistor (J1), the latter electrode being directly connected to said second capacitor Cneutro2.

14. Device according to claim 13, in which said means for providing gain G furthermore comprise a fourth resistor (R4) connected in parallel to the drain and source second electrodes of the transistor (J1).

15. Device according to claim 13, in which the system comprises a microelectromechanical system (MEMS).

16. Device according to claim 15, in which the MEMS unit is a gyrometer.

17. Device according to claim 1, in which said means for providing gain G furthermore comprise a fourth resistor (R4) connected in parallel to the drain and source second electrodes of the transistor (J1).

18. Device according to claim 17, in which the system comprises a microelectromechanical system (MEMS).

19. Device according to claim 18, in which the MEMS unit is a gyrometer.

20. Device according to claim 1, in which the system comprises a microelectromechanical system (MEMS).

21. Device according to claim 20, in which the MEMS unit is a gyrometer.

* * * * *